United States Patent [19]
Ronsisvalle

[11] Patent Number: 5,821,616
[45] Date of Patent: Oct. 13, 1998

[54] POWER MOS DEVICE CHIP AND PACKAGE ASSEMBLY

[75] Inventor: Cesare Ronsisvalle, Catania, Italy

[73] Assignee: Consorzio per la Ricerca sulla Microelettronica nel Mezzogiorno, Catania, Italy

[21] Appl. No.: 861,492

[22] Filed: May 22, 1997

Related U.S. Application Data

[63] Continuation of Ser. No. 360,596, Dec. 21, 1994, abandoned.

[30] Foreign Application Priority Data

Dec. 24, 1993 [EP] European Pat. Off. .............. 93830523

[51] Int. Cl.⁶ .......................... H01L 23/48; H01L 23/051; H01L 29/32
[52] U.S. Cl. .......................... 257/688; 257/723; 257/719; 257/341; 257/343
[58] Field of Search .................................. 257/723, 727, 257/718, 719, 688, 341, 343

[56] References Cited

U.S. PATENT DOCUMENTS

| | | | |
|---|---|---|---|
| 3,434,019 | 3/1969 | Carley | 317/235 |
| 3,667,008 | 5/1972 | Katnack | 317/235 |
| 3,831,067 | 8/1974 | Wislocky et al. | 317/234 |
| 4,008,486 | 2/1977 | Byczkowski | 257/689 |
| 4,015,278 | 3/1977 | Fukuta | 257/343 |
| 4,017,886 | 4/1977 | Tomono et al. | 357/54 |
| 4,055,884 | 11/1977 | Jambotkar | 29/571 |
| 4,070,690 | 1/1978 | Wickstrom | 257/331 |
| 4,145,700 | 3/1979 | Jambotkar | 257/341 |
| 4,236,171 | 11/1980 | Shen | 257/584 |

(List continued on next page.)

FOREIGN PATENT DOCUMENTS

| | | | |
|---|---|---|---|
| 1136291 | 11/1982 | Canada | H01L 29/94 |
| A-0421344 | 4/1991 | European Pat. Off. | H01L 23/48 |
| A-0433650 | 6/1991 | European Pat. Off. | H01L 23/48 |
| A-0450320 | 10/1991 | European Pat. Off. | H01L 21/60 |
| 0167070 | 2/1993 | Japan . | |
| 1224335 | 3/1971 | United Kingdom | H01L 11/14 |
| 2 087 648 | 5/1982 | United Kingdom | H01L 23/00 |

OTHER PUBLICATIONS

European Search Report from European Search Patent Application No. EP93830523.2 filed Dec. 24, 1993, which is the priority document for present U.S. application No. 08/861,492.

European Search Report from European Patent Application No. EP93830524.0 filed Dec. 24, 1993, which is the priority document for co–pending U.S. application No. 08/483,315.

European Search Report from European Patent Application No. 93830524.0, filed Dec. 24, 1993.

*Primary Examiner*—Sara W. Crane
*Assistant Examiner*—Alexander Oscar Williams
*Attorney, Agent, or Firm*—Wolf, Greenfield & Sacks, P.C.; James H. Morris

[57] ABSTRACT

A power MOS chip and package assembly is provided for packaging a power MOS chip that has high heat dissipation. The assembly maintains a low contact resistance to the chip using compression without damaging the chip. The package assembly includes a thermally conductive body, a chip, an electrically conductive contact washer and an external electrical terminal. The chip includes a semiconductor substrate layer, an insulating layer, a conductive material gate layer and a metal layer. The layers form a plurality of first regions that are functionally inactive and a plurality of second regions. The insulating layer is formed to be thicker in the first regions than in the second regions so that the metal layer is elevated with respect to the substrate layer by a greater amount in the first regions than in the second regions. The contact washer is placed in mechanical contact with the chip so that it exerts pressure against the metal layer in the first regions to create an electrical connection. The terminal is placed in mechanical and electrical contact with the contact washer.

41 Claims, 2 Drawing Sheets

U.S. PATENT DOCUMENTS

| | | | |
|---|---|---|---|
| 4,305,087 | 12/1981 | Wislocky | 257/694 |
| 4,329,642 | 5/1982 | Luthi et al. | 324/158 |
| 4,376,286 | 3/1983 | Lidow et al. | 257/342 |
| 4,399,449 | 8/1983 | Herman et al. | 257/339 |
| 4,412,242 | 10/1983 | Herman et al. | 257/634 |
| 4,414,560 | 11/1983 | Lidow | 257/341 |
| 4,556,896 | 12/1985 | Meddles | 257/667 |
| 4,574,208 | 3/1986 | Lade et al. | 257/365 |
| 4,593,302 | 6/1986 | Lidow et al. | 257/341 |
| 4,606,998 | 8/1986 | Clodgo et al. | 430/312 |
| 4,639,762 | 1/1987 | Neilson et al. | 257/341 |
| 4,641,418 | 2/1987 | Meddles | 29/588 |
| 4,642,419 | 2/1987 | Meddles | 174/52 |
| 4,651,181 | 3/1987 | David | 257/341 |
| 4,663,820 | 5/1987 | Ionescn | 29/590 |
| 4,680,853 | 7/1987 | Lidow et al. | 257/339 |
| 4,683,553 | 7/1987 | Nilarp | 29/580 |
| 4,723,197 | 2/1988 | Takiar et al. | 361/403 |
| 4,789,882 | 12/1988 | Lidow | 257/82 |
| 4,794,431 | 12/1988 | Park | 257/82 |
| 4,845,545 | 7/1989 | Abramowitz et al. | 257/687 |
| 4,853,762 | 8/1989 | Ewer et al. | 257/727 |
| 4,878,099 | 10/1989 | Nilarp | 257/747 |
| 4,881,106 | 11/1989 | Barron | 257/344 |
| 4,890,142 | 12/1989 | Tonnel et al. | 257/343 |
| 4,965,173 | 10/1990 | Gould | 430/317 |
| 5,016,066 | 5/1991 | Takahashi | 257/341 |
| 5,030,581 | 7/1991 | Yakushiji et al. | 437/27 |
| 5,047,833 | 9/1991 | Gould | 257/772 |
| 5,130,767 | 7/1992 | Lidow et al. | 257/339 |
| 5,153,507 | 10/1992 | Fong et al. | 257/786 |
| 5,250,821 | 10/1993 | Ferla et al. | 257/723 |
| 5,365,112 | 11/1994 | Ohshima | 257/786 |
| 5,592,026 | 1/1997 | Frisina et al. | 257/786 |
| 5,610,439 | 3/1997 | Hiyoshi et al. | 257/688 |

POWER MOS DEVICE CHIP AND PACKAGE ASSEMBLY

This application is a continuation of application Ser. No. 08/360,596, filed Dec. 21, 1994 now abandoned.

BACKGROUND OF THE INVENTION

1. Field of the Invention

The present invention relates to a power MOS device chip and package assembly.

2. Discussion of the Related Art

Power semiconductor devices having a large chip size, i.e., those with a chip diameter larger than 2 or 3 cm, are generally packaged in ceramic packages, such as the so-called "press-pack" package, which provide a higher heat dissipation capability relative to plastic packages.

Due to the high power managed by the semiconductor device, the contact area between the device chip and the external leads (normally formed from nickel-plated copper) must be as large as possible; this makes it impractical to use wire bonding techniques commonly used for power devices with lower power ratings packaged in plastic or metallic packages. Therefore, the leads are electrically connected to the chip by means of molybdenum or tungsten plates where one side of a plate is in physical contact with the leads, while the other side is in electrical contact with the chip through thin washers or discs made from silver or silver-plated copper. Good electrical contact, which reduces the contact resistance, is achieved by maintaining high contact pressure between the leads, the plates, the washers or the discs and the chip.

This technique is used with semiconductor devices such as diodes, silicon controlled rectifiers (SCRs), gate turn-off thyristors (GTOs), triacs and so on, but it presents some problems when applied to MOS power devices (power MOSFETs, IGBTs, MCTs, etc.). MOS power devices are characterized by having fragile oxide and polysilicon layers at their surface, which can be damaged by the high contact pressures required to achieve good electrical contact. However, it is expected that power MOS devices will replace the more common thyristors even in the high-power field.

In view of the state of the art as described, an object of the present invention is to produce a power MOS device chip and package assembly that is not affected by the above-mentioned drawbacks, while assuring good heat dissipation characteristics and low contact resistance.

SUMMARY OF THE INVENTION

According to one embodiment of the present invention, this and other objects are attained by means of a power MOS device chip and package assembly, the package comprising a thermally conductive body, a chip, an electrically conductive washer and an external terminal. The chip is positioned in the body and includes a semiconductor substrate layer, an insulating layer, a conductive material gate layer and a metal layer. The insulating layer overlies the semiconductor substrate layer. The conductive material gate layer is insulated from the semiconductor substrate layer by the insulating layer. The metal layer is above the gate layer. The layers form a plurality of first regions that are functionally inactive and a plurality of second regions. The insulating layer is thicker in the first regions than in the second regions so that the metal layer is elevated with respect to the substrate layer by a greater amount in the first regions than in the second regions. The contact washer is positioned in the body in mechanical contact with the chip so that it exerts pressure against the metal layer in the first regions. The terminal is positioned in the body in mechanical contact with the contact washer.

According to this embodiment of the present invention, power MOS devices can be packaged using the same techniques used for traditional power semiconductor devices which are not affected by similar problems related to fragile surface structures.

The features of the present invention will be made more evident by the following detailed description of one embodiment, illustrated as a non-limiting example in the annexed drawings, wherein:

DETAILED DESCRIPTION

Figure 1:
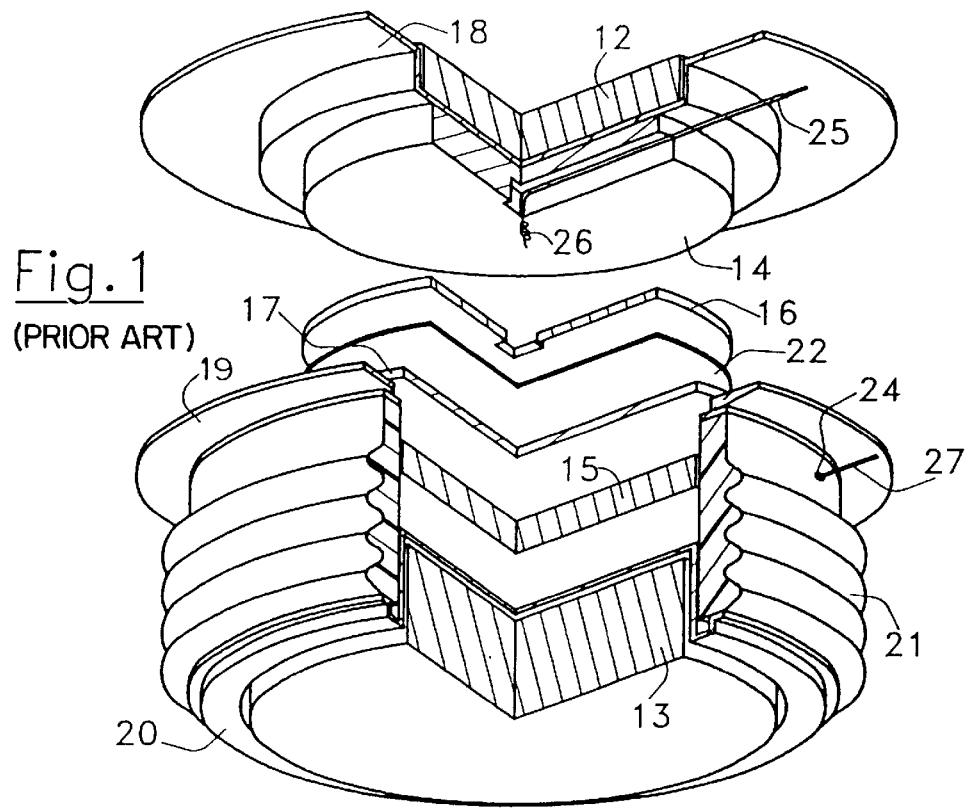
FIG. 1 is an exploded perspective view of a power MOS device chip and package assembly according to the invention.
Figure 2:
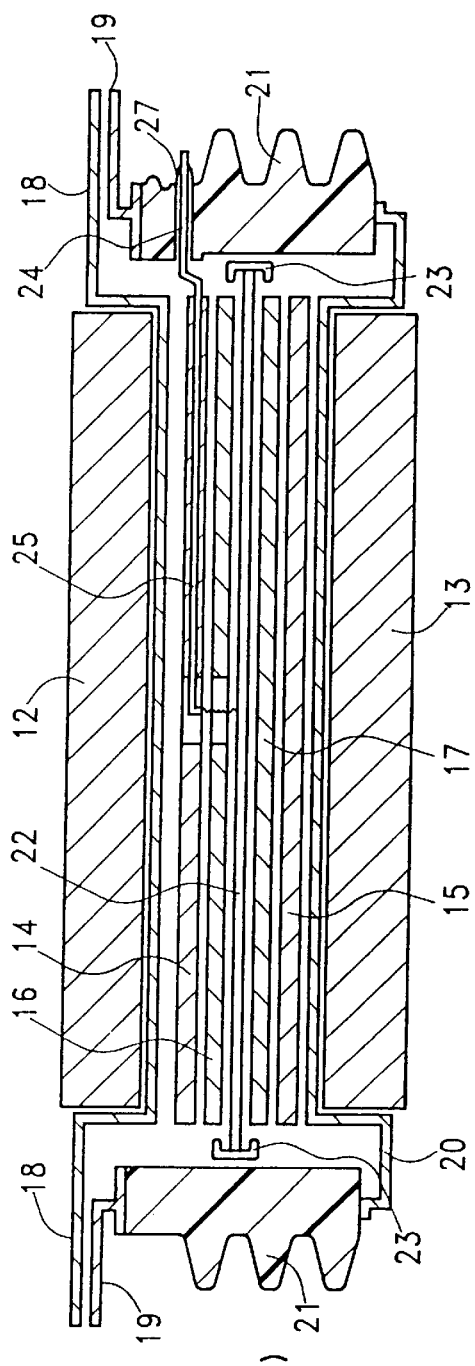
FIG. 2 is a cross-sectional view of the assembly of FIG. 1.

A so-called "press-pack" ceramic package, shown in FIGS. 1 and 2 and described for example in the European Patent Application No. 91830215.9 filed on May 23, 1991, for a power semiconductor device chip 22 comprises a first pair of plates 12 and 13 of nickel-plated copper, constituting two external electrodes of the power device packaged therein, a second pair of plates 14 and 15 of molybdenum, a contact washer 16 of silver-plated copper or silver or molybdenum, a contact disc 17 also of silver-plated copper or silver or molybdenum, an upper flange 18, an intermediate flange 19 and a lower flange 20 all of nickel-plated copper, and a ceramic body 21. The power device chip 22 is interposed between the contact washer 16 and the contact disc 17, and is maintained in position by a plastic washer 23 as shown in FIG. 2. The ceramic body 21 is provided with a passing-through hole 24 for a metallic wire 25 that supplies a control signal to the power device. The metallic wire 25 terminates with a spring-shaped end 26; the passing-through hole 24 is externally connected to a terminal 27.

Figure 3:
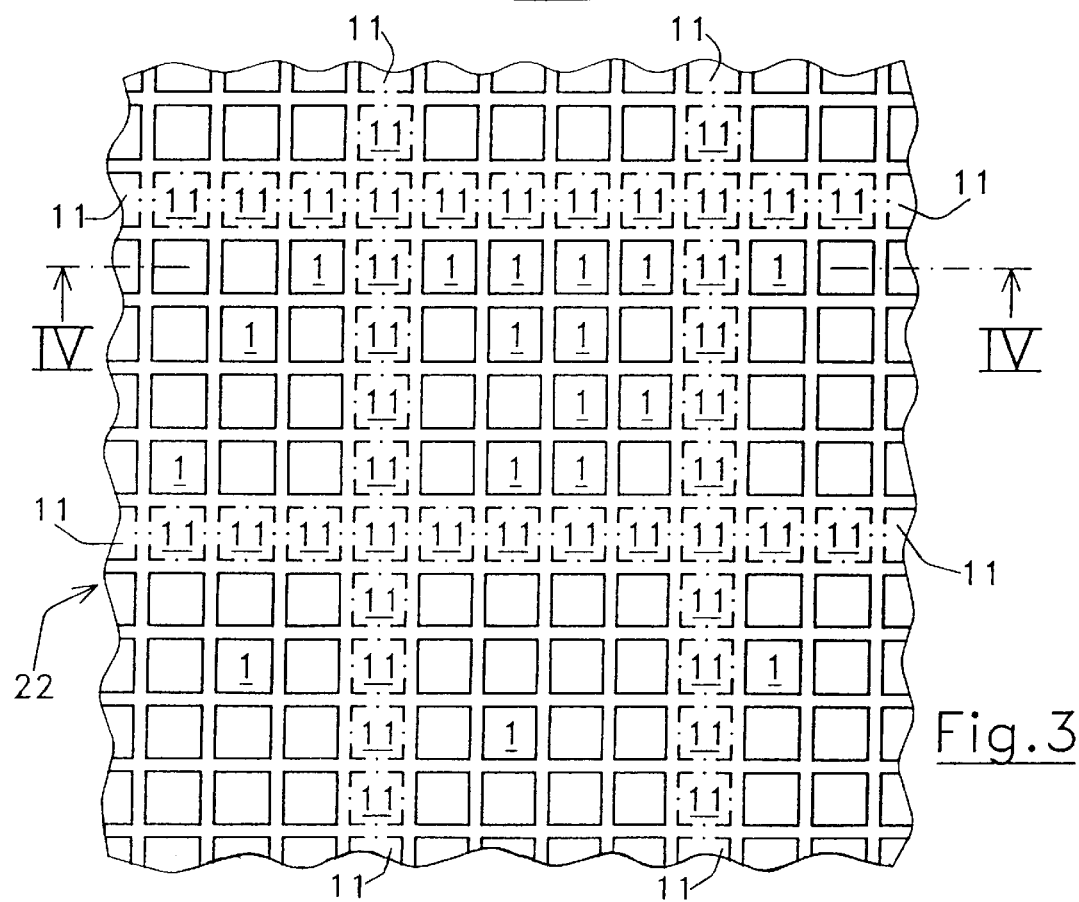
FIG. 3 is a schematic top plan view of a portion of the power MOS device chip of FIG. 1.
Figure 4:
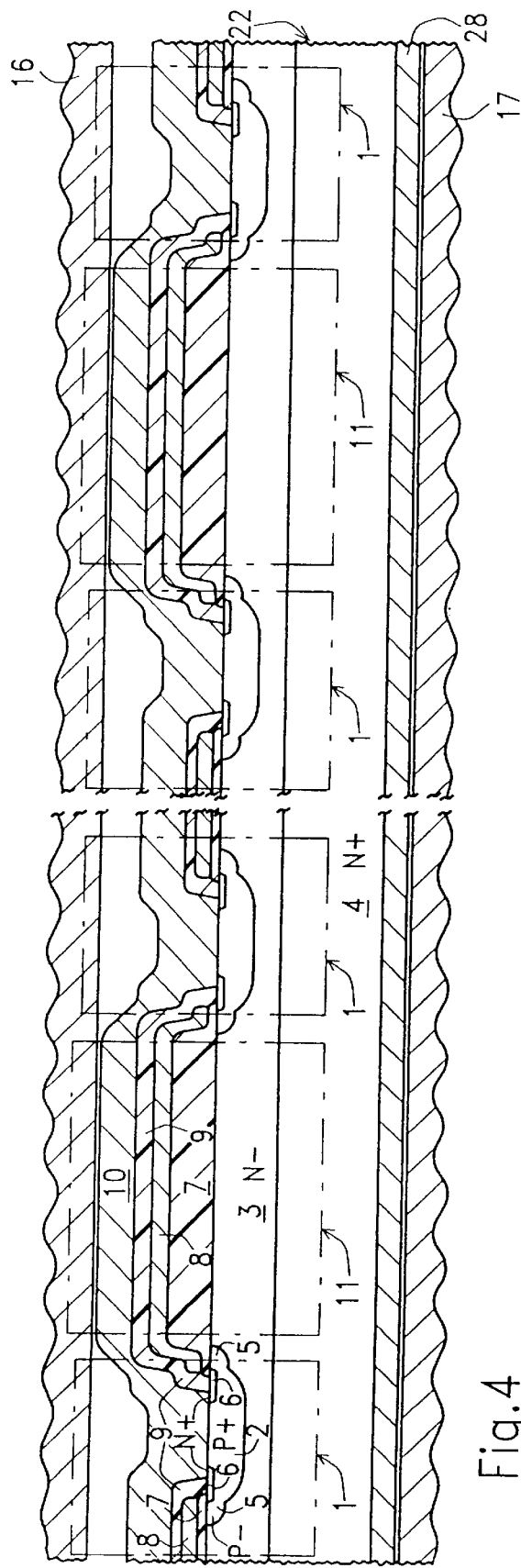
FIG. 4 is a cross-sectional view taken along section line IV—IV of FIG. 3.

As illustrated by the embodiment in FIG. 3, a power MOS device, for example a power MOSFET, is comprised of a plurality of functionally active elementary cells 1, also called "source cells", formed in a manner known in the art and disposed to form a bidimensional array. As shown in FIG. 4, the chip 22 comprised of an N+ semiconductor substrate 4 over which an N− epitaxial layer 3 is grown. Each source cell 1 represents a functionally active unit of the whole power MOSFET, and proportionally contributes to the overall power MOSFET current capability. Each source cell 1 is comprised of a P+ deep body region 2 formed into the N− epitaxial layer 3. The P+ deep body region 2 is laterally surrounded by and merged with a P− annular region 5 constituting a channel region of the source cell 1; inside the P type semiconductor region that is composed by the P− annular region 5 and by the P+ deep body region 2, an N+ annular region 6 is formed to create a source region of the elementary source cell 1. At a top surface of the N− epitaxial layer 3, an oxide layer 7 having a typical thickness of approximately 0.85 µm extends over the P− annular region 5 and partially over the N+ annular region 6 and constitutes a gate oxide layer of the source cell 1. A polysilicon layer 8 is superimposed over and autoaligned with the underlying oxide layer 7, and constitutes a polysilicon gate layer of the source cell 1. An insulating layer 9 covers the polysilicon layer 8 and is selectively etched to form contact areas that allow an overlying metal layer 10 to contact both the N+ annular region 6 and the P+ deep body region 2. The metal layer 10 contacts each of the elementary source cells 1 in a similar manner forming a source electrode for the power MOSFET. A bottom surface of the N+ substrate 4 is covered by a metal layer 28 forming a drain electrode for the power MOSFET. A contact area for the polysilicon gate layer 8 is also provided at the top surface of the chip 22, even if not shown in the drawings, to allow the spring-shaped end 26 of the wire 25 to electrically contact the polysilicon gate layer 8 when the chip 22 is packaged in the "press-pack" package described above.

According to an embodiment of the present invention, the bidimensional array of source cells 1 includes dummy cells 11, which are functionally inactive and do not contribute to the overall current capability of the power MOSFET.

As illustrated by the embodiment in FIG. 3, the dummy cells 11 are disposed to form a grid with lines of dummy cells 11 regularly spaced in each of the horizontal dimensions by an equal number of source cells 1. The dummy cells 11 have horizontal dimensions substantially identical to those of the source cells 1, and vertical dimensions different from the source cells 1 as illustrated in FIG. 4.

As distinguished from the elementary source cells 1, the dummy cells 11 have no P+ deep body region 2, P− annular region 5 and N+ annular region 6. Furthermore, the thickness of the oxide layer 7 in the dummy cells 11, approximately 2 µm, is greater than the thickness of the oxide layer 7 in the source cells 1. This results in the surface of the metal layer 10 being elevated higher over the dummy cells 11 than over the source cells 1.

When the chip 22 is to be packaged into the press-pack package described above, the chip 22 is inserted into the ceramic body 21 so that the metal layer 28 contacts the contact disc 17, which in turn contacts the molybdenum plate 15. The bottom of the body 21 is sealed by the lower flange 20 and by the nickel-plated copper plate 13. The contact washer 16 is then positioned over the top surface of the chip 22, i.e. over the metal layer 10. The top of the body 21 is sealed by the molybdenum plate 14 and by the upper flange 18. To achieve good electrical contact, the nickel-plated copper plate 12 is pressed down to place the washer 16 into mechanical contact with the top surface of the chip 22.

Since the metal layer 10 is elevated higher over the dummy cells 11 relative to the source cells 1, the contact washer 16 contacts the dummy cells 11 instead of the source cells 1; the contact pressure is thus entirely distributed among the dummy cells 11 which, because of the greater thickness of the oxide layer 7, can withstand greater mechanical stresses as compared to the source cells 1. It is thus possible to obtain a good electrical contact without damaging the power MOSFET.

Various topological distributions of dummy cells 11 and elementary source cells 1 can be utilized depending on the required contact pressure, i.e., contact resistance.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A power MOS device chip and package assembly, comprising:
   a thermally conductive body;
      a chip positioned in the body, the chip including:
         a semiconductor layer that includes a plurality of elementary functionally active regions and a plurality of functionally inactive regions,
         an insulating layer overlying the semiconductor layer,
         a conductive material gate layer disposed above the insulating layer to be insulated from the semiconductor layer, and
         a continuous metal layer insulatively disposed above the gate layer and contacting each of the elementary functionally active regions;
         wherein the insulating layer is thicker in the functionally inactive regions than in the elementary functionally active regions so that the continuous metal layer is elevated with respect to the semiconductor layer by a greater amount above the functionally inactive regions than above the elementary functionally active regions;
      an electrically conductive contact washer positioned in the body in mechanical contact with the chip so that it exerts pressure against the continuous metal layer in the functionally inactive regions; and
      an external electrical terminal positioned in the body in mechanical contact with the contact washer.

2. The power MOS device chip and package assembly as recited in claim 1, wherein the functionally inactive regions are dispersed among the elementary functionally active regions.

3. The power MOS device chip and package assembly as recited in claim 2, wherein the thermally conductive body is ceramic.

4. The power MOS device chip and package assembly as recited in claim 3, wherein the package assembly is a press-pack configuration, further comprising:
   an electrically conductive contact disc in mechanical contact with a bottom surface of the chip;
   a first electrically conductive plate superimposed over the contact washer;
   a second electrically conductive plate underlying the contact disc;
   an upper flange sealing a top opening of the body;
   a lower flange sealing a bottom opening of the body;
   an upper external plate in contact with the upper flange and forming an upper external electrical terminal; and
   a lower external plate in contact with the lower flange and forming a lower external electrical terminal.

5. The power MOS device chip and package assembly as recited in claim 1, wherein the thermally conductive body is ceramic.

6. The power MOS device chip and package assembly as recited in claim 5, wherein the package assembly is a press-pack configuration, further comprising:
   an electrically conductive contact disc in mechanical contact with a bottom surface of the chip;
   a first electrically conductive plate superimposed over the contact washer;

a second electrically conductive plate underlying the contact disc;

an upper flange sealing a top opening of the body;

a lower flange sealing a bottom opening of the body;

an upper external plate in contact with the upper flange and forming an upper external electrical terminal; and a lower external plate in contact with the lower flange and forming a lower external electrical terminal.

7. A semiconductor chip, comprising:

a semiconductor substrate having a plurality of layers formed thereon, the plurality of layers forming;

a plurality of first regions having a first thickness, the first regions being functionally inactive regions; and a plurality of second regions having a second thickness that is less than the first thickness, the plurality of first regions being dispersed among the plurality of second regions.

8. The semiconductor chip as recited in claim 7, wherein the plurality of layers includes a first insulating layer formed on the substrate, a gate layer insulated from the substrate by the insulating layer, and a metal layer formed above the gate layer.

9. The semiconductor chip as recited in claim 8, wherein the first insulating layer is an oxide.

10. The semiconductor chip as recited in claim 8, wherein the first insulating layer is thicker in the plurality of first regions than in the plurality of second regions.

11. The semiconductor chip as recited in claim 10, wherein the first insulating layer is an oxide.

12. The semiconductor chip as recited in claim 10, wherein the plurality of layers further includes a second insulating layer disposed between the metal layer and the gate layer.

13. The semiconductor chip as recited in claim 8, wherein the plurality of layers further includes a second insulating layer disposed between the metal layer and the gate layer.

14. The semiconductor chip as recited in claim 13, wherein the first insulating layer is thicker in the plurality of first regions than in the plurality of second regions.

15. The semiconductor chip as recited in claim 7, wherein the plurality of first regions is arranged in a grid.

16. The semiconductor chip as recited in claim 15, wherein the plurality of second regions is arranged in a plurality of groups, the plurality of groups of second regions being separated by the grid of first regions.

17. The semiconductor chip as recited in claim 16, wherein each of the groups of second regions is arranged in a bidimensional array.

18. The semiconductor chip as recited in claim 17, wherein each of the plurality of second regions is a functionally active elementary cell.

19. The semiconductor chip as recited in claim 17, wherein each of the plurality of second regions is a functionally active elementary cell.

20. A semiconductor chip, comprising:

a semiconductor substrate having a plurality of layers formed thereon;

the plurality of layers including a metal layer disposed above the substrate and an insulating layer disposed between the metal layer and the substrate;

the plurality of layers forming a plurality of first regions that are functionally inactive and a plurality of second regions, the first regions being thicker than the second regions so that the metal layer is elevated with respect to the substrate by a greater amount in the first regions than in the second regions, the insulating layer having a maximum thickness that is greater in the first regions than in the second regions.

21. (Amended) The semiconductor chip as recited in claim 20, wherein each of the plurality of second regions is a functionally active elementary cell.

22. The semiconductor chip as recited in claim 21, wherein the semiconductor substrate is a power MOS substrate.

23. A semiconductor chip, comprising:

a semiconductor substrate having a plurality of layers formed thereon, the plurality of layers including a metal layer and an insulating layer disposed between the metal layer and the substrate, the plurality of layers forming;

a plurality of first regions, each of the plurality of first regions being functionally inactive, the metal layer having a first upper surface in the first regions that is substantially parallel to the substrate, the first upper surface establishing a first thickness for the plurality of layers; and a plurality second regions, each of the plurality of second regions including a first portion and a second portion, the insulating layer in the first portion being thinner than the insulating layer in the plurality of first regions, the metal layer in the first portion having a second upper surface that is substantially parallel to the substrate, the second upper surface establishing a second thickness for the plurality of layers that is less than the first thickness, the metal layer in the second portion being disposed on the substrate and having a third upper surface that is substantially parallel to the substrate, the third upper surface establishing a third thickness for the plurality of layers that is less than the second thickness.

24. The semiconductor chip as recited in claim 23, wherein each of the plurality of second regions is a functionally active elementary cell.

25. The semiconductor chip as recited in claim 24, wherein the semiconductor substrate is a power MOS substrate.

26. The semiconductor chip recited in claim 21, wherein the elementary functionally active regions are arranged in a plurality of groups, the groups being separated by the functionally inactive regions.

27. The semiconductor chip recited in claim 26, wherein the functionally inactive regions are arranged in a grid that separates the groups of elementary functionally active regions.

28. The semiconductor chip recited in claim 27, wherein the groups of elementary functionally active regions are arranged in bidimensional arrays.

29. The semiconductor chip recited in claim 20, wherein the metal layer is continuous and contacts each of the elementary functionally active regions and each of the functionally inactive regions.

30. The semiconductor chip recited in claim 20, wherein the plurality of layers includes a gate layer disposed between the insulating layer and the metal layer.

31. The semiconductor chip recited in claim 30, wherein the plurality of layers includes a second insulating layer disposed between the gate layer and the metal layer.

32. The power MOS device chip and package assembly as recited in claim 1, wherein the chip has an overall current capability and the functionally inactive regions are constructed and arranged so as not to contribute to the overall current capability of the chip.

33. The semiconductor chip as recited in claim 7, wherein the chip has an overall current capability and the first regions are constructed and arranged so as not to contribute to the overall current capability of the chip.

34. The semiconductor chip as recited in claim 8, wherein the metal layer interconnects each of the first regions and each of the second regions.

35. The semiconductor chip as recited in claim 19, wherein the semiconductor chip is a power MOS device chip.

36. The semiconductor chip as recited in claim 35, wherein the chip has an overall current capability and the first regions are constructed and arranged so as not to contribute to the overall current capability of the chip.

37. The semiconductor chip as recited in claim 20, wherein the chip has an overall current capability and the functionally inactive regions are constructed and arranged so as not to contribute to the overall current capability of the chip.

38. The semiconductor chip as recited in claim 22, wherein the chip has an overall current capability and the functionally inactive regions are constructed and arranged so as not to contribute to the overall current capability of the chip.

39. The semiconductor chip as recited in claim 23, wherein the metal layer interconnects each of the first regions and each of the second regions.

40. The semiconductor chip as recited in claim 43, wherein the chip has an overall current capability and the first regions are constructed and arranged so as not to contribute to the overall current capability of the chip.

41. The semiconductor chip as recited in claim 46, wherein the chip has an overall current capability and the first regions are constructed and arranged so as not to contribute to the overall current capability of the chip.

* * * * *

UNITED STATES PATENT AND TRADEMARK OFFICE
CERTIFICATE OF CORRECTION

PATENT NO. : 5,821,616

DATED : October 13, 1998

INVENTOR(S): Cesare Ronsisvale

It is certified that error appears in the above-identified patent and that said Letters Patent is hereby corrected as shown below:

In column 6, line 3 delete "(Amended)"

Signed and Sealed this

Twelfth Day of January, 1999

Attest:

Attesting Officer

*Acting Commissioner of Patents and Trademarks*